(12) United States Patent
Soda et al.

(10) Patent No.: US 10,229,945 B2
(45) Date of Patent: Mar. 12, 2019

(54) SOLID STATE IMAGE PICKUP ELEMENT AND METHOD OF MANUFACTURING SOLID STATE IMAGE PICKUP ELEMENT

(71) Applicant: CANON KABUSHIKI KAISHA, Tokyo (JP)

(72) Inventors: Takehiko Soda, Yokohama (JP); Akira Okita, Yamato (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 15/595,072

(22) Filed: May 15, 2017

(65) Prior Publication Data
US 2017/0358618 A1 Dec. 14, 2017

(30) Foreign Application Priority Data

Jun. 9, 2016 (JP) .................................. 2016-115008

(51) Int. Cl.
| | |
|---|---|
| *H01L 31/062* | (2012.01) |
| *H01L 31/113* | (2006.01) |
| *H01L 27/146* | (2006.01) |
| *H01L 27/144* | (2006.01) |
| *H04N 5/369* | (2011.01) |

(52) U.S. Cl.
CPC .... *H01L 27/14614* (2013.01); *H01L 27/1443* (2013.01); *H01L 27/14616* (2013.01); *H04N 5/369* (2013.01)

(58) Field of Classification Search
CPC ......... H01L 27/14643; H01L 27/14609; H01L 27/14614; H01L 27/14616; H01L 27/1443
USPC .......................................................... 257/291
See application file for complete search history.

(56) References Cited

U.S. PATENT DOCUMENTS

| | | | |
|---|---|---|---|
| 7,687,299 B2 | 3/2010 | Ichikawa | |
| 7,968,922 B2 | 6/2011 | Ichikawa | |
| 8,445,356 B1* | 5/2013 | Cai | ................... H01L 21/76232 257/374 |
| 9,147,708 B2 | 9/2015 | Okita et al. | |
| 9,276,027 B2 | 3/2016 | Okita et al. | |
| 9,681,078 B2 | 6/2017 | Tsuchiya et al. | |
| 2011/0147838 A1* | 6/2011 | Gossner | ............ H01L 29/66356 257/345 |

(Continued)

FOREIGN PATENT DOCUMENTS

JP 2005-286168 A 10/2005

*Primary Examiner* — Theresa T Doan
(74) *Attorney, Agent, or Firm* — Venable LLP

(57) ABSTRACT

Provided is a solid state image pickup element including a MOS type transistor which amplifies a signal which is based on electric charges generated in a photoelectric conversion unit of a pixel. A channel region of the transistor is divided into a source-side region and a drain-side region. When a conductivity type of the transistor is defined as a first conductivity type and a conductivity type which is opposite to the first conductivity type is defined as a second conductivity type, a concentration of a first conductivity type impurity in the source-side region is higher than a concentration of the first conductivity type impurity in the drain-side region or a concentration of a second conductivity type impurity in the drain-side region is higher than a concentration of the second conductivity type impurity in the source-side region.

14 Claims, 13 Drawing Sheets

(56) References Cited

U.S. PATENT DOCUMENTS

2015/0041866 A1* 2/2015 Tanaka ............... H01L 27/146
                                                    257/239
2016/0071902 A1  3/2016 Okita et al.
2016/0360126 A1  12/2016 Soda et al.

* cited by examiner

SOLID STATE IMAGE PICKUP ELEMENT AND METHOD OF MANUFACTURING SOLID STATE IMAGE PICKUP ELEMENT

BACKGROUND OF THE INVENTION

Field of the Invention

The present invention relates to a solid state image pickup element including a transistor which amplifies a signal which is based on electric charges generated in a photoelectric conversion unit of a pixel.

Description of the Related Art

In regard to solid state image pickup elements used in a digital still camera, a digital camcorder and so forth, it is proposed to shape a MOS type transistor which configures a source follower circuit of the pixel into an buried channel type transistor. For example, in Japanese Patent Application Laid-Open No. 2005-286168, a channel doped layer adapted to improve embedability of a transistor is provided in a channel region of the transistor which amplifies a signal which is based on electric charges generated in a photoelectric conversion unit of a pixel. Thereby, a 1/f noise which is generated in the channel region of the amplification transistor is reduced and thereby an SN ratio of a pixel signal is improved.

However, when the channel doped layer is provided in the transistor so as to shape the transistor into the buried channel type transistor, a threshold voltage of the transistor is reduced under the influence of an n-type impurity. In particular, it is requested to operate the amplification transistor which configures the source follower circuit of the pixel in a saturation region. However, when the threshold voltage is reduced, it is feared that an amplification operation may be performed out of the saturation region and thereby linearity of the source follower circuit may be worsened.

SUMMARY OF THE INVENTION

The present invention has been made in view of the above-mentioned circumstances. A solid state image pickup element according to one embodiment of the present invention is a solid state image pickup element which includes a MOS type transistor which amplifies a signal which is based on electric charges generated in a photoelectric conversion unit of a pixel, in which a channel region of the transistor is divided into a source-side region and a drain-sider region, and when a conductivity type of the transistor is defined as a first conductivity type and a conductivity type which is opposite to the first conductivity type is defined as a second conductivity type, a concentration of a first conductivity type impurity in the source-side region is higher than a concentration of the first conductivity type impurity in the drain-side region or a concentration of a second conductivity type impurity in the drain-side region is higher than a concentration of the second conductivity type impurity in the source-side region.

A method of manufacturing solid state image pickup element according to another embodiment of the present invention is a method of manufacturing a solid state image pickup element which includes a MOS type transistor which amplifies a signal which is based on electric charges generated in a photoelectric conversion unit of a pixel, including the implantation step of making impurity concentrations of a source-side region and a drain-side region of a channel region of the transistor different from each other, in which when a conductivity type of the transistor is defined as a first conductivity type and a conductivity type which is opposite to the first conductivity type is defined as a second conductivity type, an amount of a first conductivity type impurity which is implanted into the source-side region is larger than an amount of the first conductivity type impurity which is implanted into the drain-side region or an amount of a second conductivity type impurity which is implanted into the drain-side region is larger than an amount of the second conductivity type impurity which is implanted into the source-side region.

Further features of the present invention will become apparent from the following description of exemplary embodiments with reference to the attached drawings.

DESCRIPTION OF THE EMBODIMENTS

Preferred embodiments of the present invention will now be described in detail in accordance with the accompanying drawings.

First Embodiment

Figure 1:
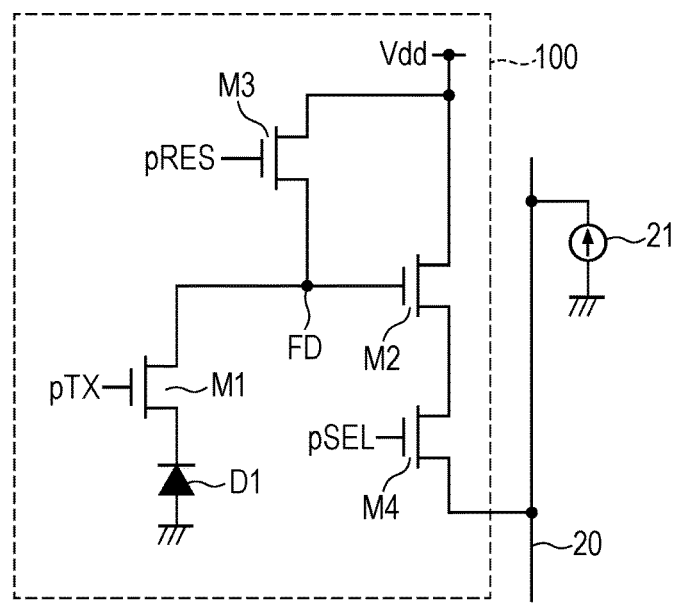
FIG. 1 is a schematic diagram illustrating one example of an equivalent circuit of a pixel in a solid state image pickup element according to a first embodiment.

A solid state image pickup element according to the first embodiment will be described by using FIG. 1, FIG. 2A to FIG. 2C and FIG. 3A to FIG. 3D. FIG. 1 is a schematic diagram illustrating one example of an equivalent circuit of a pixel 100 in a solid state image pickup element according to the first embodiment. Incidentally, although, in the following, description will be made on the assumption that the pixel 100 is applied to a MOS type solid state image pickup element, the first embodiment is not limited thereto and it is also possible to apply the pixel 100 to a CCD type solid state image pickup element.

The pixel 100 in the first embodiment illustrated in FIG. 1 may include a photodiode D1, a transfer transistor M1, an amplification transistor M2, a reset transistor M3, a selection transistor M4 and so forth. In the above-mentioned transistors, the transfer transistor M1, the reset transistor M3 and the selection transistor M4 are controlled respectively on the basis of control signals pTX, pRES and pSEL which are sent from a vertical scan circuit (not illustrated). The pixel 100 in the first embodiment may include at least the photodiode D1 and the amplification transistor M2 and other transistors may be omitted.

The photodiode D1 is a photoelectric conversion unit having a p-n junction and photo-electrically converts light with which the pixel 100 has been irradiated and accumulates generated electric charges in an accumulation region. In the following description, it is assumed that in electrons and positive holes which have been generated by photoelectric conversion, the photodiode D1 accumulates the electrons and the pixel 100 outputs a pixel signal according an amount of electric charges of the accumulated electrons. However the first embodiment is not limited to such a configuration as mentioned above and it is also possible to configure such that, in the electrons and the positive holes which have been generated by photoelectric conversion, the photodiode D1 accumulates the positive holes and the pixel 100 outputs a pixel signal according to an amount of electric charges of the accumulated positive holes.

The transfer transistor M1 is controlled on the basis of the control signal pTX and transfers the electric charges that the photodiode D1 has accumulated to an input node. Here, the input node means a floating diffusion region FD which has been formed at a connecting point of three terminals, that is, a drain terminal of the transfer transistor M1, a gate terminal of the amplification transistor M2 and a source terminal of the reset transistor M3.

The amplification transistor M2 outputs a signal according to the amount of the electric charges which have been transferred to the floating diffusion region FD to a column signal line 20. A current source 21 is connected to one end of the column signal line 20 and the amplification transistor M2, the column signal line 20 and the current source 21 configure a source follower circuit of the pixel 100.

The reset transistor M3 is controlled on the basis of the control signal pRES and resets the electric charges that the floating diffusion region FD retains. The selection transistor M4 is controlled on the basis of the control signal pSEL and connects an output terminal of the amplification transistor M2 to the column signal line 20. Incidentally, in a system of connecting the pixel 100 to the column signal line 20 in accordance with a potential which is based on the electric charges that the floating diffusion region FD retains, it is possible to omit the selection transistor M4.

A potential Vdd is supplied to drain terminals of the amplification transistor M2 and the reset transistor M3. In addition, a reference potential such as a ground potential and so forth is supplied to the photodiode D1 and the transistors M1 to M4.

Figure 2A:
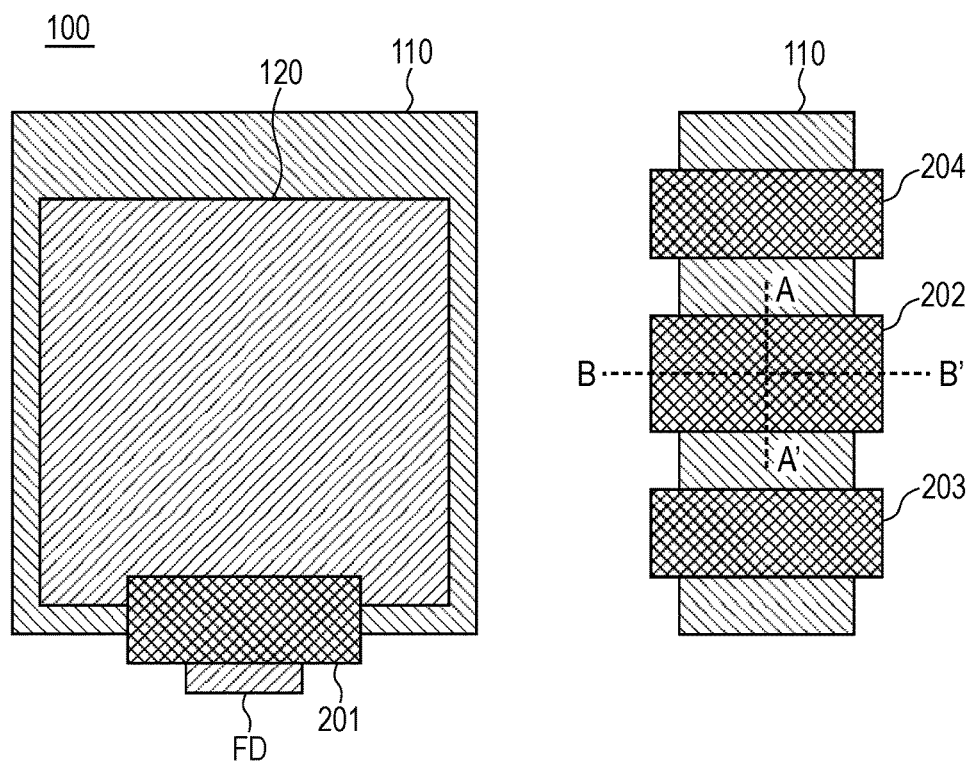
FIG. 2A is a schematic diagram illustrating one example of a layout of a part of the pixel in the solid state image pickup element according to the first embodiment.

FIG. 2A is a schematic diagram illustrating one example of a layout (a plan view) of a part of the pixel 100 in the solid state image pickup element according to the first embodiment. On an active region 110 of the pixel 100 illustrated in FIG. 2A, an accumulation region 120 of the photodiode D1 and the floating diffusion region FD are arranged. In addition, respective gate electrodes 201, 202, 203 and 204 of the transfer transistor M1, the amplification transistor M2, the reset transistor M3 and the selection transistor M4 are arranged also on the active region 110.

In the pixel 100 illustrated in FIG. 2A, the p-n junction of the photodiode D1 is formed by the p-type active region 110 and the n-type accumulation region 120. Further, a p-type semiconductor region (not illustrated) may be also formed on a surface of the n-type accumulation region 120 in order to make the photodiode D1 have an embedded photodiode structure. The amplification transistor M2, the reset transistor M3 and the selection transistor M4 are respectively formed by arranging the gate electrodes 202, 203 and 204 thereof on one active region 110 at predetermined intervals. The gate electrodes of these transistors are made of, for example, polysilicon (polycrystalline silicon). Source regions and drain regions of these transistors are commonalized.

Figure 2B:
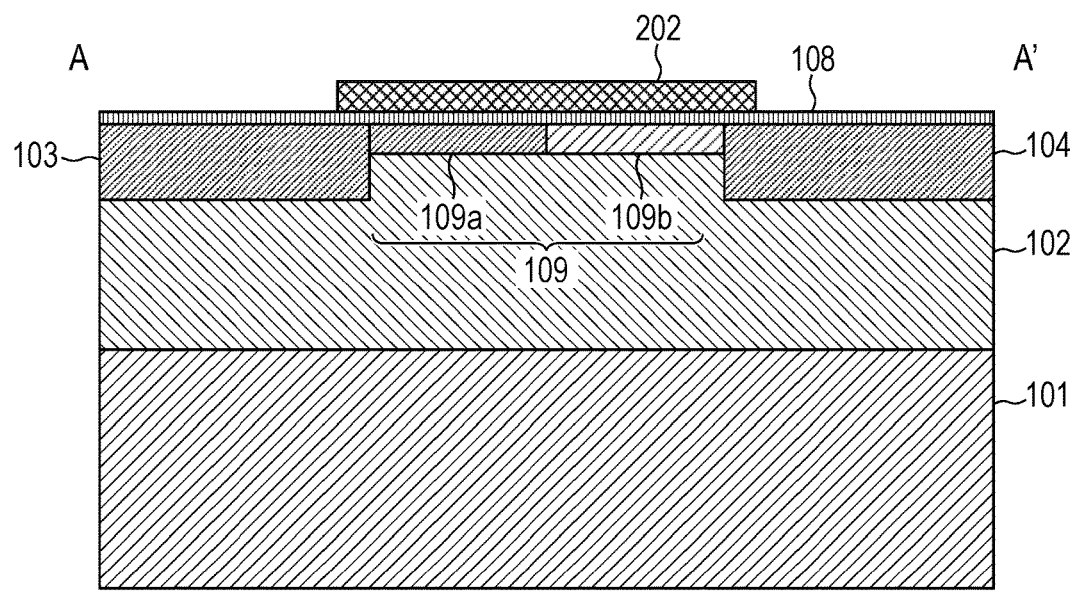
FIG. 2B is a sectional diagram along the A-A' line of an amplification transistor in the solid state image pickup element according to the first embodiment.
Figure 2C:
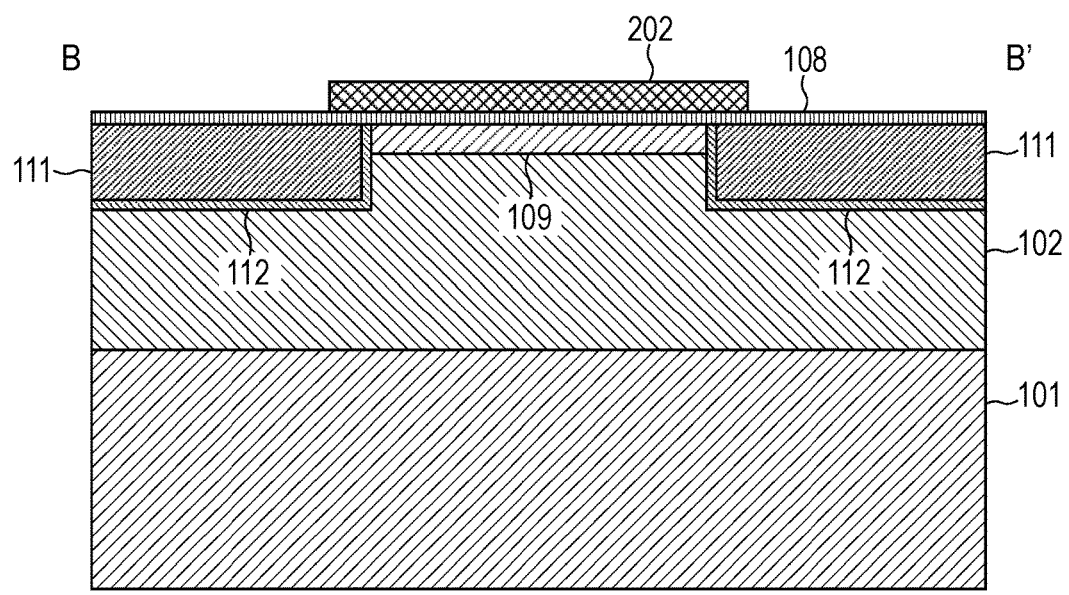
FIG. 2C is a sectional diagram along the B-B' line of the amplification transistor in the solid state image pickup element according to the first embodiment.

FIG. 2B and FIG. 2C are sectional diagrams of the amplification transistor M2 in the solid state image pickup element according to the first embodiment. FIG. 2B illustrates a sectional diagram of the amplification transistor M2 along the A-A' line in FIG. 2A and FIG. 2C illustrates a sectional diagram of the amplification transistor M2 along the line B-B' in FIG. 2A. The amplification transistor M2 includes a semiconductor substrate 101, a well region 102, a source region 103, a drain region 104, an oxide film 108, a channel doped region 109, the gate electrode 202, an element isolation region 111 and so forth.

In the amplification transistor M2 illustrated in FIG. 2B and FIG. 2C, the semiconductor substrate 101, the source region 103 and the drain region 104 are n-type semiconductor regions and the well region 102 is a p-type semiconductor region. The silicon oxide film 108 is formed between the well region 102 and the gate electrode 202 and a wiring layer, a color filter and a micro lens which are not illustrated are formed above the gate electrode 202.

Incidentally, it is known that in the amplification transistor M2 which configures the source follower circuit of the pixel 100, the electrons which flow in a channel are trapped in lattice defects of an interface between a channel region and the oxide film 108 and are emitted from the lattice defects and thereby a so-called l/f noise is generated. When the l/f noise is generated, the SN ratio of the pixel signal which is output from the pixel 100 is reduced.

Accordingly, as illustrated in FIG. 2B and FIG. 2C, the amplification transistor M2 in the first embodiment has the n-type channel doped region 109 in the channel region. Thereby, the embedability of the channel region is improved. That is, the amplification transistor M2 is configured such that the channel doped region 109 that the electrons flow is formed in the well region 102 which is located away from the interface between the channel region and the oxide film 108. Consequently, since a probability that the electrons are trapped in the lattice defects which are present at the interface between the channel doped region 109 and the oxide film 108 is reduced, it becomes possible to reduce the 1/f noise.

However, when a channel doped layer is provided in the amplification transistor M2 so as to shape it into the buried channel type transistor, a threshold voltage of the amplification transistor M2 is reduced under the influence of the n-type impurity. In particular, although it is requested to operate the amplification transistor M2 which configures the source follower circuit of the pixel 100 in a saturation region, when the threshold voltage is reduced, the amplification operation is performed out of the saturation region and therefore it is feared that the linearity of the source follower circuit may be worsened.

Accordingly, in the first embodiment, the channel doped region 109 is further divided into a source-side first channel doped region 109a whose n-type impurity concentration is relatively high and a drain-side second channel doped region 109b whose n-type impurity concentration is relatively low.

Here, the impurity concentration means a net impurity concentration that a concentration of an additive impurity has been compensated for a reverse conductivity type impurity. For example, when a concentration of an n-type additive impurity is higher than a concentration of a p-type additive impurity in a predetermined region, the region becomes an n-type semiconductor region. Then, when the concentration of the p-type additive impurity is higher than the concentration of the n-type additive impurity in the predetermined region, the region becomes a p-type semiconductor region. The net impurity concentration has a value obtained by subtracting a concentration of a low-concentration semiconductor region from a concentration of a high-concentration semiconductor region. For example, in the following description, when an/the "n-type impurity concentration" is referred to, it means a value obtained by subtracting a concentration of a low-concentration p-type semiconductor region from a concentration of a high-concentration n-type semiconductor region. In addition, when a/the "p-type impurity concentration" is referred to, it means a value obtained by subtracting a concentration of a low-concentration n-type semiconductor region from a concentration of a high-concentration p-type semiconductor region.

Thereby, since in the source-side first channel doped region 109a, the embedability is improved, the noise of the amplification transistor M2 is reduced. On the other hand, since formation of the channel becomes difficult in the drain-side second channel doped region 109b, a reduction in threshold voltage is suppressed. That is, according to the first embodiment, it becomes possible to simultaneously attain a reduction in noise and suppression of the reduction in threshold voltage of the amplification transistor M2.

In the first embodiment, as illustrated in FIG. 2B, in the channel doped region 109, a section ranging from the boundary between the channel doped region 109 and the source region 103 to the center of the channel doped region 109 is defined as the first channel doped region 109a. In addition, in the channel doped region 109, a section ranging from the boundary between the channel doped region 109 and the drain region 104 to the center of the channel doped region 109 is defined as the second channel doped region 109b. It is desirable that n-type impurity concentrations of the first channel doped region 109a and the second channel doped region 109b be between about $1\times10^{15}$ and about $1\times10^{18}$ $(cm^{-3})$. In addition, it is desirable that n-type impurity concentrations of the source region 103 and the drain region 104 be at least about $1\times10^{18}$ $(cm^{-3})$. However, the impurity concentrations are not limited to the above-mentioned values and the impurity concentrations of the source region 103 and the drain region 104 may have values at which inversion and depletion of the regions are not induced regardless of the voltage applied to the gate electrode 202.

On the other hand, as illustrated in FIG. 2C, the element isolation region 111 adapted to avoid interference with other transistors in the active region 110 is formed in the section along the B-B' line of the amplification transistor M2. The element isolation region 111 is formed by, for example, STI (Shallow Trench Isolation). In addition, a channel stopper region 112 adapted to suppress dark currents which leak out through the interface between the element isolation region 111 and the well region 102 is formed on the boundary between the element isolation region 111 and the well region 102. The channel stopper region 112 is formed by implanting boron into the boundary between the well region 102 and the element isolation region 111 by, for example, ion implantation.

Figure 3A:
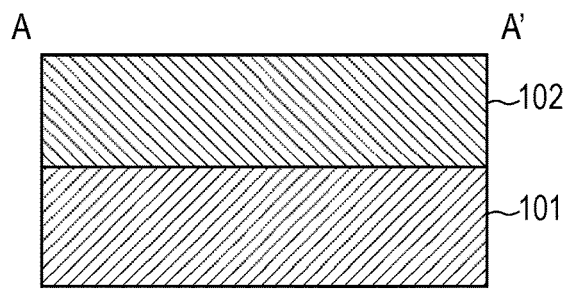
FIGS. 3A, 3B, 3C and 3D are schematic diagrams illustrating one example of a method of manufacturing the amplification transistor in the solid state image pickup element according to the first embodiment.

A method of manufacturing the amplification transistor M2 in the first embodiment illustrated in FIG. 2A to FIG. 2C will be described by using FIG. 3A to FIG. 3D. FIG. 3A is a schematic diagram illustrating one example of a process of forming the well region 102 in the method of manufacturing the amplification transistor M2 in the first embodiment. Boron is implanted into the semiconductor substrate 101 by, for example, ion implantation and thereby the p-type well region 102 is formed on an upper surface of the n-type semiconductor substrate 101.

In addition, the element isolation region 111 illustrated in FIG. 2C is formed by, for example, STI. Then, boron is implanted into the boundary between the well region 102 and the element isolation region 111 by, for example, ion implantation and thereby the channel stopper region 112 illustrated in FIG. 2C is formed.

Figure 3B:
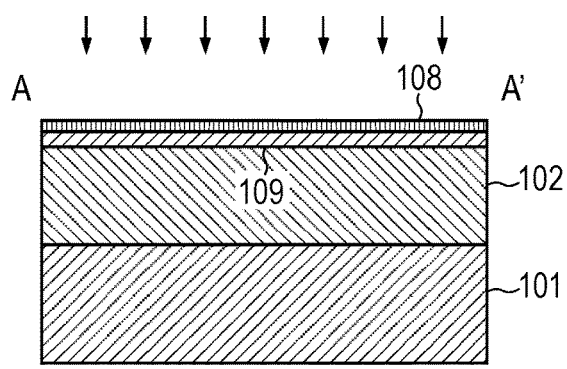

FIG. 3B is a schematic diagram illustrating one example of a process of forming the oxide film 108 and the channel doped region 109 in the method of manufacturing the amplification transistor M2 in the first embodiment. First, the silicon oxide film 108 is formed on an upper surface of the well region 102 by, for example, thermal oxidation. Then, arsenic is implanted through the oxide film 108 from above the well region 102 by, for example, ion implantation and thereby the channel doped region 109 is formed on the upper surface of the well region 102.

Figure 3C:
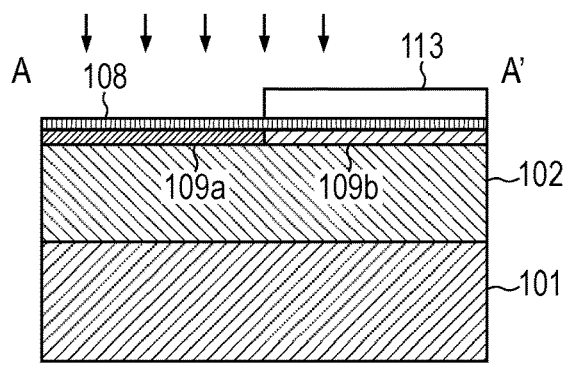

FIG. 3C is a schematic diagram illustrating one example of a process of forming the first channel doped region 109a and the second channel doped region 109b in the method of manufacturing the amplification transistor M2 in the first embodiment. First, a photoresist 113 is patterned on a drain-side upper surface of the oxide film 108 by, for example, lithography. Then, arsenic is implanted through the oxide film 108 from above the channel doped region 109 by using the photoresist 113 as a mask by, for example, ion implantation and thereby the first channel doped region 109a is formed in a source-side region of the channel doped region 109. Then, a drain-side region of the channel doped region 109 is left as it is as the second channel doped region 109b. Then, the photoresist 113 is removed.

Figure 3D:
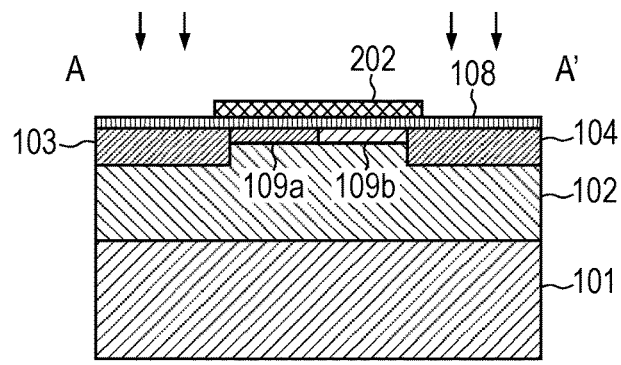

FIG. 3D is a schematic diagram illustrating one example of a process of forming the gate electrode 202 in the method of manufacturing the amplification transistor M2 in the first embodiment. First, the not illustrated photoresist is patterned in a region other than a part where the gate electrode 202 will be formed on an upper surface of the oxide film 108 by, for example, lithography. Then, polysilicon (polycrystalline silicon) is formed on the upper surface of the oxide film 108 by using the photoresist as the mask by, for example, CVD and thereby the gate electrode 202 is formed. In this case, it is preferable to form the gate electrode 202 so as to partially superpose on the first channel doped region 109a planarly. After the photoresist has been removed, arsenic is implanted through the oxide film 108 from above the well region 102 by, for example, ion implantation and thereby the source region 103 and the drain region 104 are formed.

As described above, the amplification transistor in the first embodiment includes the n-type channel doped region in the channel region and the channel doped region is divided into the source-side first channel doped region and the drain-side second channel doped region. Then, the n-type impurity concentration of the first channel doped region is made higher than the n-type impurity concentration of the second channel doped region. Thereby, it becomes possible to obtain the solid state image pickup element and the method of manufacturing solid state image pickup element making it possible to reduce the noise generated in the amplification transistor while suppressing the reduction in threshold voltage of the amplification transistor of the pixel.

Incidentally, although the description has been made on the assumption that the amplification transistor M2 is the n-channel type MOS transistor, it is also possible to obtain the same advantageous effect as the above also when the amplification transistor M2 is a p-channel type MOS transistor. That is, when a conductivity type of the amplification transistor M2 is defined as a first conductivity type and a conductivity type which is opposite to the first conductivity type is defined as a second conductivity type, it would be sufficient as long as a first conductivity type impurity concentration of the first channel doped region 109a is made higher than a first conductivity type impurity concentration of the second channel doped region 109b.

In addition, although in the above-mentioned description, arsenic has been used as the n-type impurity in ion implantation, other materials may be used as long as the materials are n-type impurities and, for example, phosphorus, antimony and so forth may be used. In addition, although boron has been used as the p-type impurity in ion implantation, other materials may be used as long as the materials are p-type impurities and, for example, gallium, indium and so forth may be used.

Second Embodiment

Figure 4:
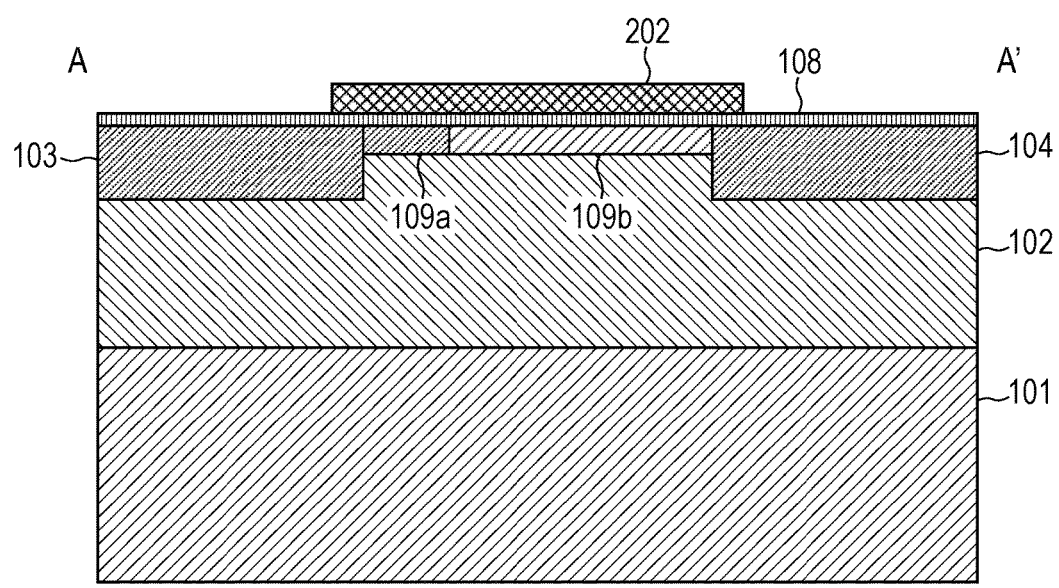
FIG. 4 is a sectional diagram along the A-A' line of an amplification transistor in a solid state image pickup element according to a second embodiment.

A solid state image pickup element according to the second embodiment will be described by using FIG. 4 and FIG. 5A to FIG. 5D. The layout of the pixel 100 in the second embodiment is the same as the layout of the pixel 100 in the first embodiment illustrated in FIG. 2A. However, the structure of the amplification transistor M2 in the section along the A-A' line in FIG. 2A is different from that in the first embodiment. FIG. 4 is a sectional diagram along the A-A' line of the amplification transistor M2 in the solid state image pickup element according to the second embodiment. Since the sectional diagram along the B-B' line and other configurations are the same as those in the first embodiment, description thereof is omitted. In the following, parts which are different from those in the first embodiment in the structure of the amplification transistor M2 in the second embodiment will be described.

The amplification transistor M2 in the second embodiment illustrated in FIG. 4 is different from the amplification transistor M2 in the first embodiment illustrated in FIG. 2B in lengths of the first channel doped region 109a and the second channel doped region 109b in a source-drain direction (an A-A' direction). This is because the second embodiment is different from the first embodiment in the method of manufacturing the amplification transistor M2. In the first embodiment, the first channel doped region 109a and the second channel doped region 109b are formed and then the gate electrode 202 is formed. On the other hand, in the second embodiment, the gate electrode 202 is formed and then the first channel doped region 109a that the n-type impurity concentration is high is formed.

Figure 5A:
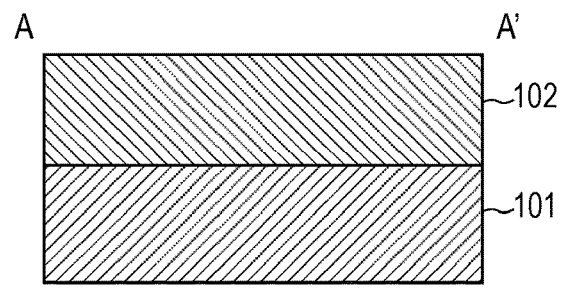
FIGS. 5A, 5B, 5C and 5D are schematic diagrams illustrating one example of a method of manufacturing the amplification transistor in the solid state image pickup element according to the second embodiment.
Figure 5B:
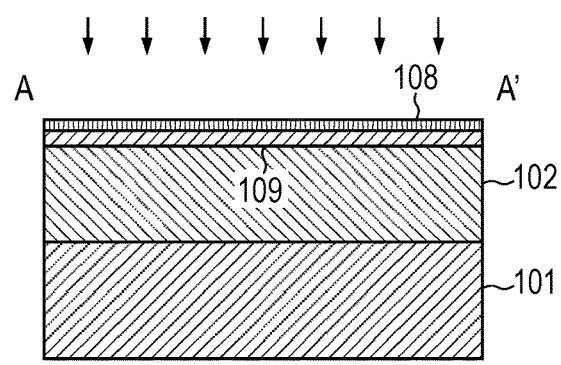

The method of manufacturing the amplification transistor M2 in the second embodiment illustrated in FIG. 4 will be described by using FIG. 5A to FIG. 5D. FIG. 5A is a schematic diagram illustrating one example of a process of forming the well region 102 in the method of manufacturing the amplification transistor M2 of the solid state image pickup element according to the second embodiment. In addition, FIG. 5B is a schematic diagram illustrating one example of a process of forming the oxide film 108 and the channel doped region 109 in the method of manufacturing the amplification transistor M2 in the second embodiment. Since the processes of forming the well region 102, the oxide film 108 and the channel doped region 109 which are illustrated in FIG. 5A and FIG. 5B are the same as the processes of the first embodiment illustrated in FIG. 3A and FIG. 3B, description thereof is omitted.

Figure 5C:
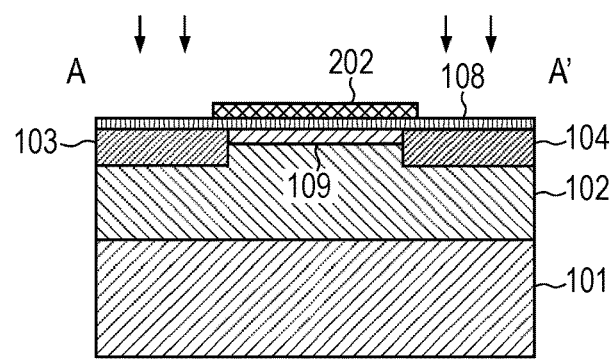

FIG. 5C is a schematic diagram illustrating one example of a process of forming the gate electrode 202 in the method of manufacturing the amplification transistor M2 in the second embodiment. First, the not illustrated photoresist is patterned in the region other than the part where the gate electrode 202 will be formed on the upper surface of the oxide film 108 by, for example, lithography. Then, polysilicon (polycrystalline silicon) is formed on the upper surface of the oxide film 108 by using the photoresist as the mask by, for example, CVD and thereby the gate electrode 202 is formed. In this case, it is preferable to form the gate electrode 202 so as to partially superpose on the first channel doped region 109a planarly. After the photoresist has been removed, arsenic is implanted through the oxide film 108 from above the well region 102 by, for example, ion implantation and thereby the source region 103 and the drain region 104 are formed.

Figure 5D:
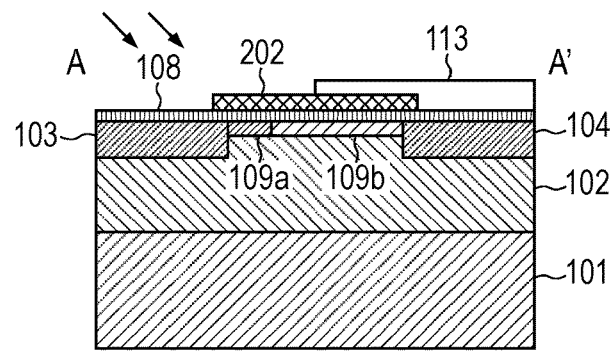

FIG. 5D is a schematic diagram illustrating one example of a process of forming the first channel doped region 109a and the second channel doped region 109b in the method of manufacturing the amplification transistor M2 in the second embodiment. First, the photoresist 113 is patterned on drain-side upper surfaces of the gate electrode 202 and the oxide film 108 by, for example, lithography. In this case, it is preferable to pattern the photoresist 113 such that a source-side upper surface of the gate electrode 202 is exposed.

Then, arsenic is implanted through the oxide film 108 obliquely from above the gate electrode 202 by using the photoresist 113 as the mask by, for example, ion implantation and thereby the first channel doped region 109a is formed in the source-side region of the channel doped region 109. In this case, it is preferable to perform ion implantation obliquely from above a source-side region of the gate electrode 202 such that arsenic infiltrates into the channel doped region 109 which is located under the gate electrode 202. Then, the drain-side region of the channel doped region 109 is left as it is as the second channel doped region 109b. Then, the photoresist 113 is removed.

Incidentally, when there are variations in accuracy of alignment or shape of the photoresist 113 in formation of the first channel doped region 109a, the position and the length of the first channel doped region 109a relative to those of the gate electrode 202 are varied for every amplification transistor M2. Consequently, a variation occurs in characteristic for every amplification transistor M2 and the noise is generated in the pixel signal that the pixel 100 outputs.

However, in the second embodiment, the first channel doped region 109a is formed by implanting ions of the impurity obliquely from above the gate electrode 202. Accordingly, the position and the length of the first channel doped region 109a relative to those of the gate electrode 202 are determined depending on the position of a source-side end of the gate electrode 202 and become constant not depending on the accuracy of alignment and the shape of the photoresist 113. Accordingly, in the second embodiment, it becomes possible to reduce the noise of the signal that the pixel 100 outputs by suppressing the variation in characteristic for every amplification transistor M2.

As described above, in the second embodiment, the ions of the impurity are implanted into the channel doped region 109 obliquely from above the source-side region of the gate electrode 202 of the amplification transistor M2 and thereby the first channel doped region 109a and the second channel doped region 109b are formed in the channel doped region 109. Thereby, in the second embodiment, it becomes possible to reduce the noise of the signal that the pixel 100 outputs by suppressing the variation in characteristic for every amplification transistor M2 in addition to the advantageous effect which is the same as that of the first embodiment.

Third Embodiment

Figure 6:
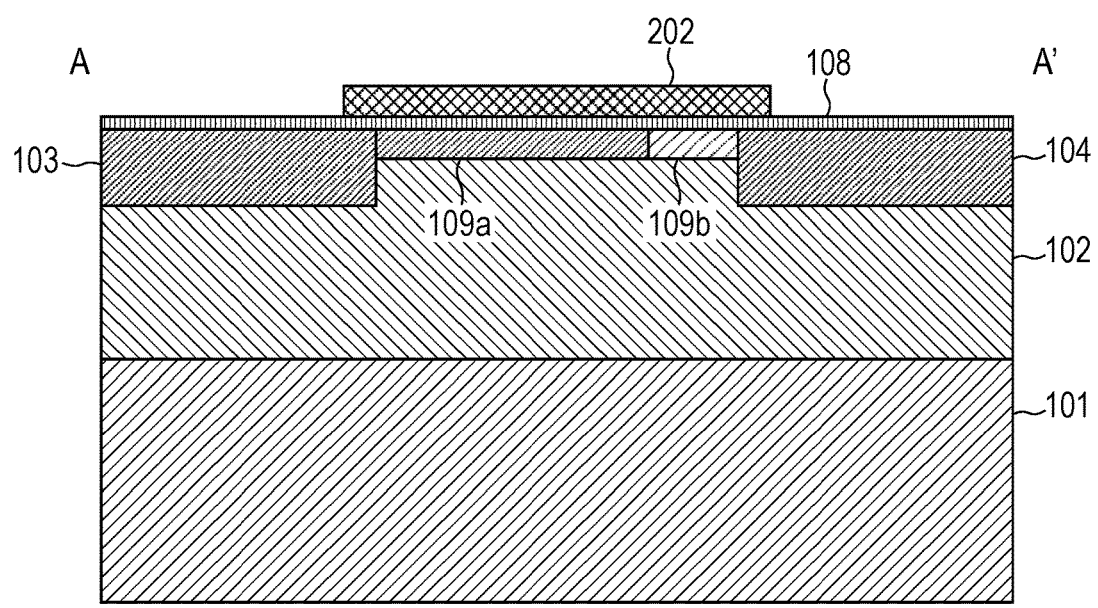
FIG. 6 is a sectional diagram along the A-A' line of an amplification transistor in a solid state image pickup element according to a third embodiment.

A solid state image pickup element according to the third embodiment will be described by using FIG. 6 and FIG. 7A to FIG. 7D. The layout of the pixel 100 in the third embodiment is the same as the layout of the pixel 100 in the first embodiment illustrated in FIG. 1. However, the structure of the amplification transistor M2 in the section along the A-A' line in FIG. 2A is different from those in the first and second embodiments. FIG. 6 is a sectional diagram along the A-A' line of the amplification transistor M2 in the solid state image pickup element according to the third embodiment. Since the sectional diagram along the B-B' line and other configurations are the same as those in the second embodiment, description thereof is omitted. In the following, parts which are different from those in the second embodiment in the structure of the amplification transistor M2 in the third embodiment will be described.

The amplification transistor M2 in the third embodiment illustrated in FIG. 6 is different from the amplification transistor M2 in the second embodiment illustrated in FIG. 4 in that the length of the second channel doped region 109b is made shorter than the length of the first channel doped region 109a. This is because the third embodiment is different from the second embodiment in the method of manufacturing the amplification transistor M2. In the second embodiment, ions of arsenic are implanted obliquely from above the source-side region of the gate electrode 202 and thereby the first channel doped region 109a is formed. On the other hand, in the third embodiment, ions of boron are implanted obliquely from above a drain-side region of the gate electrode 202 and thereby the second channel doped region 109b is formed.

Figure 7A:
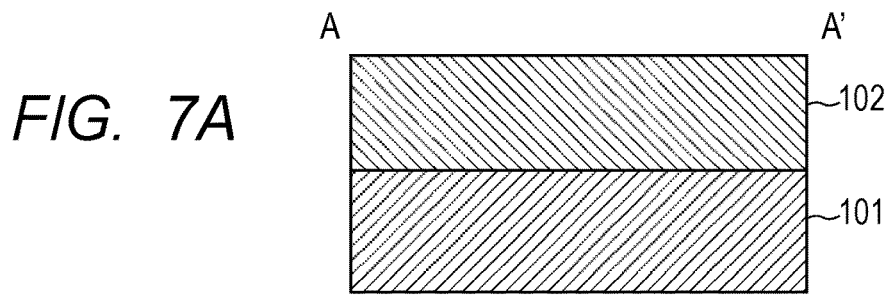
FIGS. 7A, 7B, 7C and 7D are schematic diagrams illustrating one example of a method of manufacturing the amplification transistor in the solid state image pickup element according to the third embodiment.
Figure 7B:
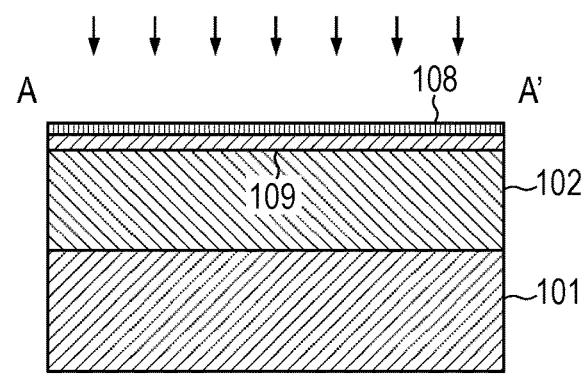

The method of manufacturing the amplification transistor M2 in the third embodiment illustrated in FIG. 6 will be described by using FIG. 7A to FIG. 7D. FIG. 7A is a schematic diagram illustrating one example of a process of forming the well region 102 in the method of manufacturing the amplification transistor M2 in the third embodiment. In addition, FIG. 7B is a schematic diagram illustrating one example of a process of forming the oxide film 108 and the channel doped region 109 in the method of manufacturing the amplification transistor M2 in the third embodiment. Since the processes of forming the well region 102, the oxide film 108 and the channel doped region 109 illustrated in FIG. 7A and FIG. 7B are the same as the processes illustrated in FIG. 5A to FIG. 5D in the second embodiment, description thereof is omitted.

Figure 7C:
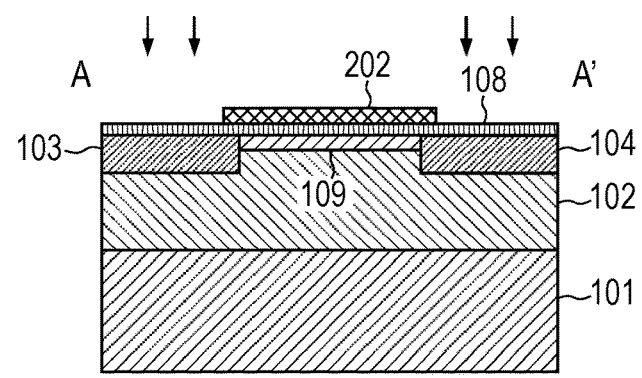

FIG. 7C is a schematic diagram illustrating one example of a process of forming the gate electrode 202 in the method of manufacturing the amplification transistor M2 in the third embodiment. First, the not illustrated photoresist is patterned in the region other than the part where the gate electrode 202 will be formed on the upper surface of the oxide film 108 by, for example, lithography. Then, polysilicon (polycrystalline silicon) is formed on the upper surface of the oxide film 108 by using the photoresist as the mask by, for example, CVD and thereby the gate electrode 202. In this case, it is preferable to form the gate electrode 202 so as to partially superpose on the first channel doped region 109a planarly. After the photoresist has been removed, arsenic is implanted through the oxide film 108 from above the well region 102 by, for example, ion implantation and thereby the source region 103 and the drain region 104 are formed.

Figure 7D:
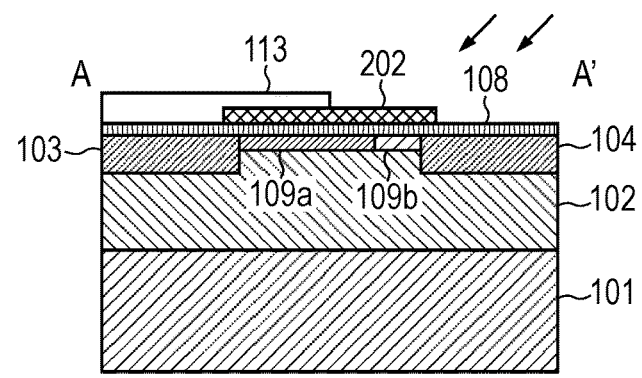

FIG. 7D is a schematic diagram illustrating one example of a process of forming the first channel doped region 109a and the second channel doped region 109b in the method of manufacturing the amplification transistor M2 in the third embodiment. First, the photoresist 113 is patterned on the source-side upper surfaces of the gate electrode 202 and the oxide film 108 by, for example, lithography. In this case, it is preferable to pattern the photoresist 113 such that the drain-side upper surface of the gate electrode 202 is exposed.

Then, boron is implanted through the oxide film 108 obliquely from above the gate electrode 202 by using the photoresist 113 as the mask by, for example, ion implantation and thereby the second channel doped region 109b is formed in the drain-side region of the channel doped region 109. In this case, it is preferable to perform ion implantation obliquely from above the drain-side region of the gate electrode 202 such that boron infiltrates into the channel doped region 109 which is located under the gate electrode 202. Then, the source-side region of the channel doped region 109 is left as it is as the first channel doped region 109a. Here, it is desirable that the amount of boron to be implanted have a value at which the conductivity type of the second channel doped region 109b is not changed to the p-type. Then, the photoresist 113 is removed.

It is possible to ensure the linearity of the source follower circuit of the pixel 100 also by this configuration similarly to the second embodiment. Further, since in the third embodiment, the source-side first channel doped region 109a is made larger than the second channel doped region 109b and the embeddability is improved in most part of the channel region, the noise of the amplification transistor M2 is reduced. That is, according to the third embodiment, it is possible to more suppress the reduction in threshold voltage of the amplification transistor M2 of the pixel 100 in addition to simultaneous attainment of the reduction in noise and suppression of the reduction in threshold voltage of the amplification transistor M2.

As described above, in the third embodiment, ions of the impurity are implanted into the channel doped region 109 obliquely from above the drain-side region of the gate electrode 202 of the amplification transistor M2 and thereby the first channel doped region 109a and the second channel doped region 109b are formed in the channel doped region 109. Thereby, it becomes possible to more suppress the reduction in threshold voltage of the amplification transistor M2 of the pixel 100 in addition to the advantageous effect which is the same as that of the second embodiment.

Fourth Embodiment

A solid state image pickup element according to the fourth embodiment will be described by using FIG. 6 and FIG. 7A to FIG. 7D similarly to the third embodiment. The solid state image pickup element according to the fourth embodiment is different from the solid state image pickup element according to the third embodiment in that the conductivity type of the channel doped region 109 is not the n-type but the p-type. Since the fourth embodiment is the same as the third embodiment in other respects, description thereof is omitted. In the following, parts which are different from those in the third embodiment in the structure of the amplification transistor M2 in the fourth embodiment will be described.

A method of manufacturing the amplification transistor M2 in the fourth embodiment illustrated in FIG. 6 will be described by using FIG. 7A to FIG. 7D similarly to the third embodiment. The method of manufacturing the amplification transistor M2 in the fourth embodiment is the same as that of the third embodiment in the processes illustrated in FIG. 7A to FIG. 7D. However, the method according to the fourth embodiment is different from the method according to the third embodiment in that boron is implanted in the process illustrated in FIG. 7B in place of arsenic.

Thereby, in the fourth embodiment, not the n-type but the p-type channel doped region 109 is formed in the process illustrated in FIG. 7B. When the channel doped region is formed as the p-type channel doped region as in the fourth embodiment, a strongly inverted layer is formed in the channel region by voltage application to the gate electrode 202 and the layer so formed acts as the channel. Accordingly, unlike the first to third embodiments in which the channel doped region 109 is formed so as to have the n-type, the embedability of the amplification transistor M2 is not improved by the channel doped region 109 in the fourth embodiment. However, it is possible for the fourth embodiment to have the advantageous effect which is the same as that of the first to third embodiments in the point that it is possible to make the threshold voltages different from each other between the source side and the drain side of the amplification transistor M2.

As described above, the amplification transistor M2 in the fourth embodiment includes the p-type channel doped region 109 in the channel region and the channel doped region 109 is divided into the source-side first channel doped region 109a and the drain-side second channel doped region 109b. Then, the p-type impurity concentration of the second channel doped region 109b is made higher than the p-type impurity concentration of the first channel doped region 109a. Thereby, since inversion of the drain-side region of the channel region of the amplification transistor M2 becomes more difficult that the inversion of the source-side region thereof, it is possible to suppress the reduction in threshold voltage of the amplification transistor M2.

Incidentally, although description has been made on the assumption that the amplification transistor M2 is the n-channel type MOS transistor, it is also possible to obtain the same advantageous effect also when the amplification transistor M2 is the p-channel type MOS transistor. That is, when the conductivity type of the amplification transistor M2 is defined as the first conductivity type and the conductivity type which is opposite to the first conductivity type is defined as the second conductivity type, it would be sufficient as long as the second conductivity type impurity concentration of the second channel doped region 109b is made higher than the second conductivity type impurity concentration of the first channel doped region 109a.

Fifth Embodiment

Figure 8A:
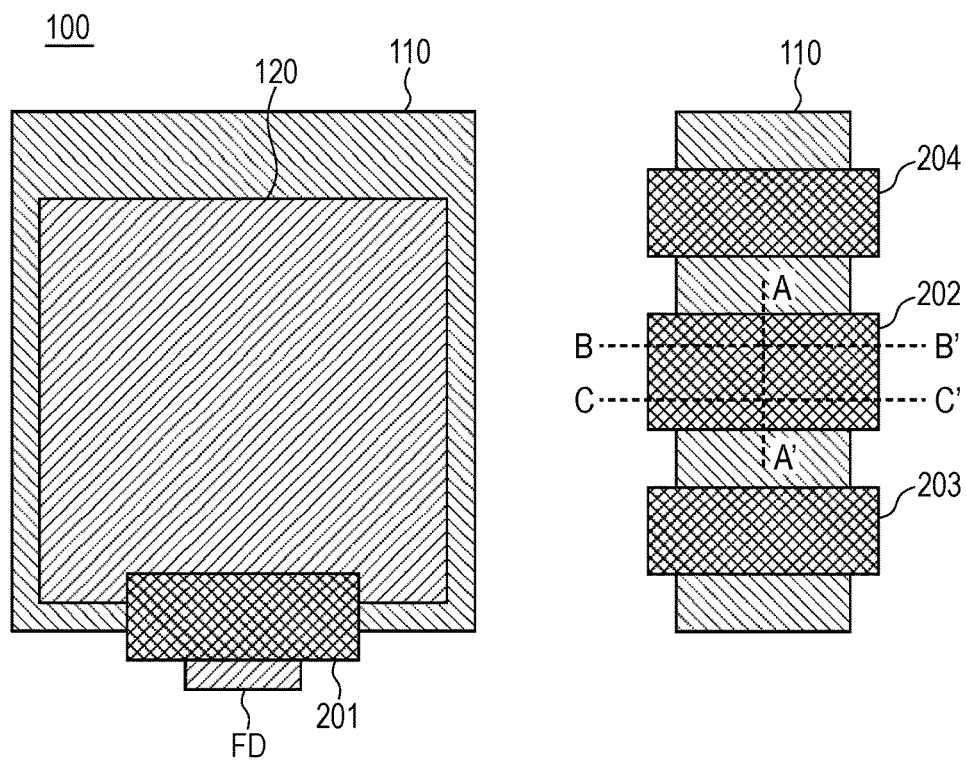
FIG. 8A is a sectional diagram illustrating one example of a layout of a part of a pixel in a solid state image pickup element according to a fifth embodiment.
Figure 8B:
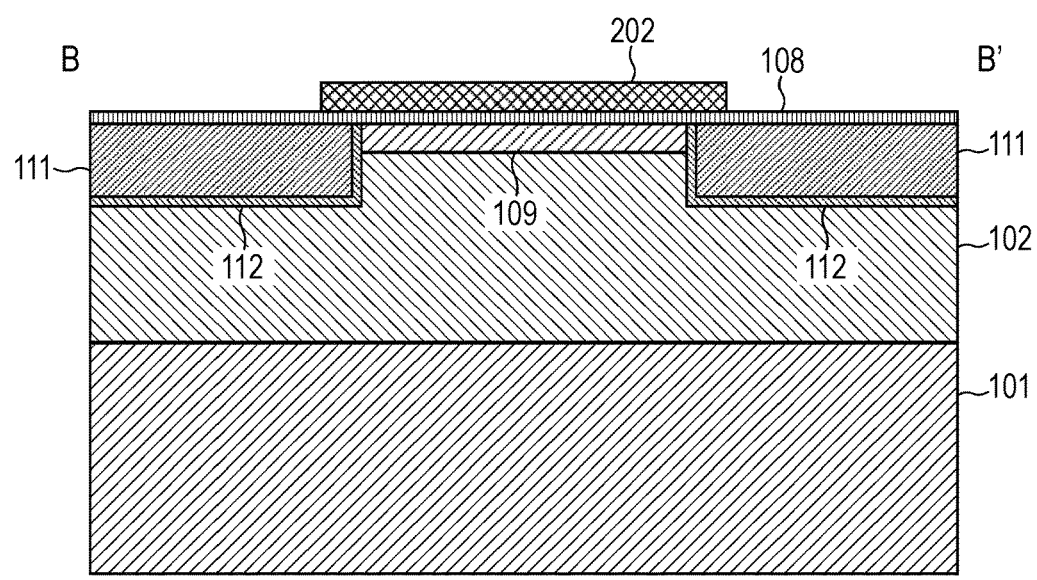
FIG. 8B is a sectional diagram along the B-B' line of an amplification transistor in the solid state image pickup element according to the fifth embodiment.
Figure 8C:
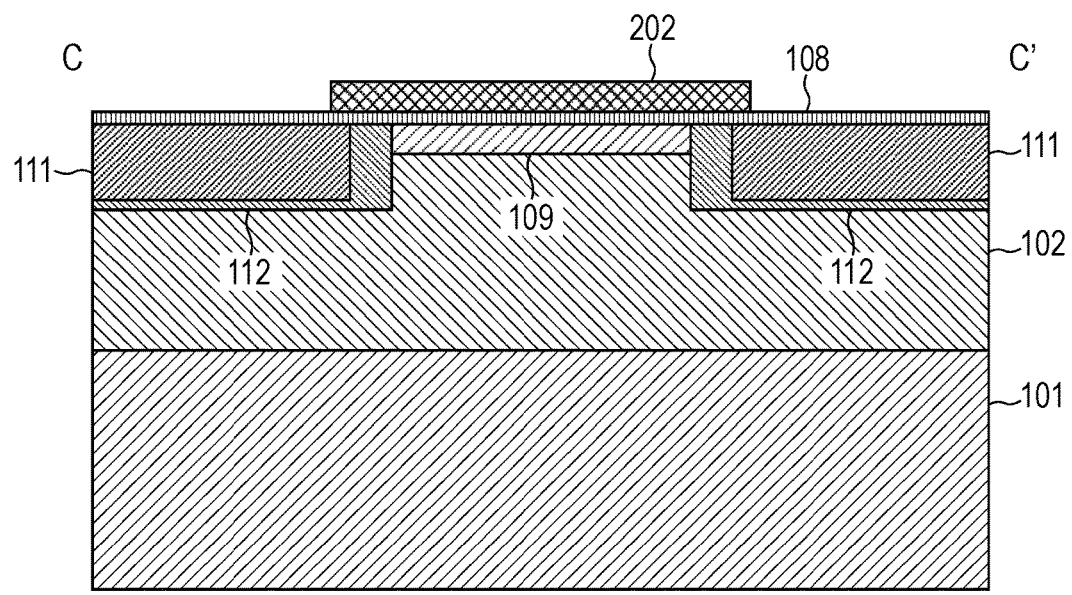
FIG. 8C is a sectional diagram along the C-C' line of the amplification transistor in the solid state image pickup element according to the fifth embodiment.

A solid state image pickup element according to the fifth embodiment will be described by using FIG. 8A to FIG. 8C. FIG. 8A is a schematic diagram illustrating one example of a layout (a plan view) of a part of the pixel 100 in the solid state image pickup element according to the fifth embodiment. The layout of the pixel 100 in the fifth embodiment is the same as the layout of the pixel 100 in the first embodiment illustrated in FIG. 2A. However, the structure of the amplification transistor M2 in the sections along the B-B' line and the C-C' line in FIG. 2A is different from that in the first embodiment. FIG. 8B is a sectional diagram along the B-B' line of the amplification transistor M2 in the solid state image pickup element according to the fifth embodiment. In addition, FIG. 8C is a sectional diagram along the C-C' line of the amplification transistor M2 in the solid state image pickup element according to the fifth embodiment. Since the sectional diagram along the A-A' line and other configurations are the same as those of the first embodiment, description thereof is omitted. In the following, parts which are different from those in the first embodiment in the structure of the amplification transistor M2 in the fifth embodiment will be described.

The amplification transistor M2 in the fifth embodiment illustrated in FIG. 8B and FIG. 8C is different from the amplification transistor M2 in the first embodiment illustrated in FIG. 2C in that a p-type impurity concentration of the drain-side region of the channel stopper region 112 is made higher than a p-type impurity concentration of the source-side region thereof. Thereby, it is possible to suppress the reduction in threshold voltage of the amplification transistor M2.

As described above, the channel stopper region 112 is formed by implanting boron into the boundary between the element isolation region 111 and the well region 102 after the element isolation region 111 has been formed. In this case, it is possible to make the p-type impurity concentrations in the respective regions different from each other by forming the source-side region and the drain-side region of the channel stopper region 112 by using the photoresist and so forth in different processes and changing the implantation amount of boron in every process. Since the implanted boron diffuses in a plane direction, it is possible to make the p-type impurity concentration of the drain-side region of the channel region higher than the p-type impurity concentration of the source-side region thereof by making the amount of boron which is implanted into the drain-side region of the channel stopper region 112 larger than the amount of boron which is implanted into the source-side region thereof.

Incidentally, in the fifth embodiment, it would be sufficient as long as the p-type impurity concentrations of the source-side region and the drain-side region of the channel stopper region 112 are made different from each other and, for example, an energy used for ion implantation may be changed between the source-side region and the drain-side region in place of changing the boron implantation amount between the source-side region and the drain-side region. However, it is desirable that the amount of boron which is implanted into the channel stopper region 112 have a value at which the conductivity type of each of the first channel doped region 109a and the second channel doped region 109b is not changed to the p-type.

As described above, in the fifth embodiment, the channel stopper region 112 is provided on the boundary between the well region 102 and the element isolation region 111 of the amplification transistor M2. Then, the second conductivity type impurity concentration of the drain-side region of the channel stopper region 112 is made higher than the second conductivity type impurity concentration of the source-side region thereof. Thereby, it is possible to suppress the reduction in threshold voltage of the amplification transistor M2.

Sixth Embodiment

Figure 9:
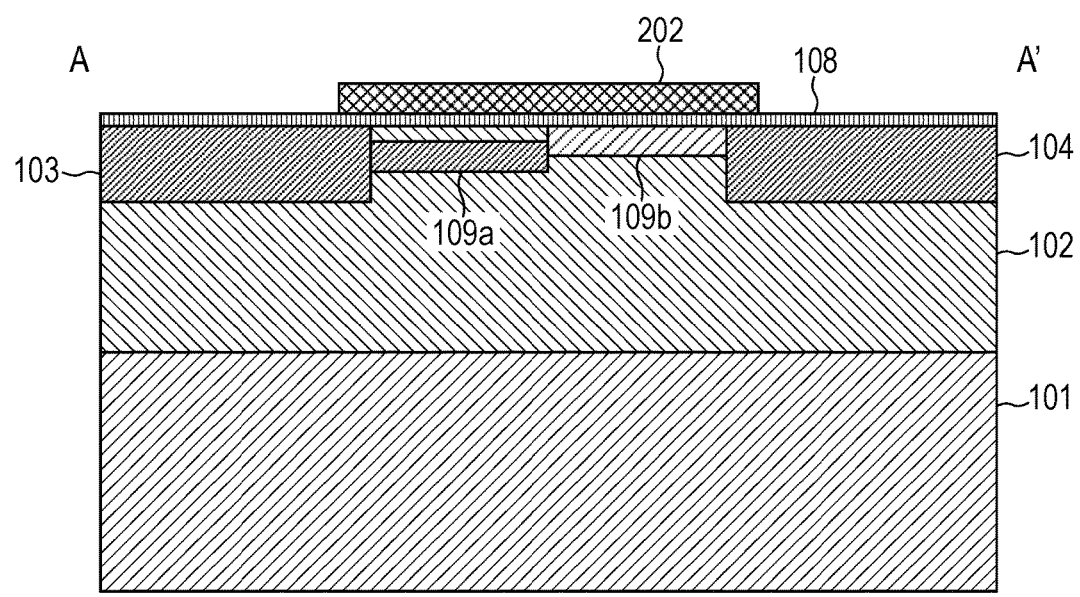
FIG. 9 is a sectional diagram along the A-A' line of an amplification transistor in a solid state image pickup element according to a sixth embodiment.

A solid state image pickup element according to the sixth embodiment will be described by using FIG. 9 and FIG. 10A to FIG. 10D. The layout of the pixel 100 in the sixth embodiment is the same as the layout of the pixel 100 in the first embodiment illustrated in FIG. 2A. However, the sixth embodiment is different from the first embodiment in the structure of the amplification transistor M2 in the section along the A-A' line in FIG. 2A. FIG. 9 is a sectional diagram along the A-A' line of the amplification transistor M2 in the solid state image pickup element according to the sixth embodiment. Since the sectional diagram along the B-B' line and other configurations are the same as those of the first embodiment, description thereof is omitted. In the following, parts which are different from those of the first embodiment in the structure of the amplification transistor M2 in the sixth embodiment will be described.

The amplification transistor M2 in the sixth embodiment illustrated in FIG. 9 is different from the amplification transistor M2 in the first embodiment illustrated in FIG. 2B in that the first channel doped region 109a is formed at a relatively deep position in the well region 102 and the second channel doped region 109b is formed at a relatively shallow position in the well region 102. More strictly speaking, a region which is the highest in the n-type impurity concentration in the first channel doped region 109a is formed at a position which is deeper than that of a region which is the highest in the n-type impurity concentration in the second channel doped region 109b.

Thereby, since the embedability is improved in the source-side channel region that the first channel doped region 109a is formed away from the oxide film 108, the noise of the amplification transistor M2 is reduced. On the other hand, since the influence of the voltage applied to the gate electrode 202 is increased in the drain-side channel region that the second channel doped region 109b is formed near the gate electrode 202, the threshold voltage of the amplification transistor M2 of the pixel 100 is increased. That is, according to the sixth embodiment, it is possible to simultaneously attain the reduction in noise and suppression of the reduction in threshold voltage of the amplification transistor M2.

A method of manufacturing the amplification transistor M2 in the sixth embodiment illustrated in FIG. 9 will be described by using FIG. 10A to FIG. 10D. In the sixth embodiment, depths that the first channel doped region 109a and the second channel doped region 109b are formed are controlled by changing the implantation energy of the impurity which is implanted into the first channel doped region 109a and the second channel doped region 109b.

Figure 10A:
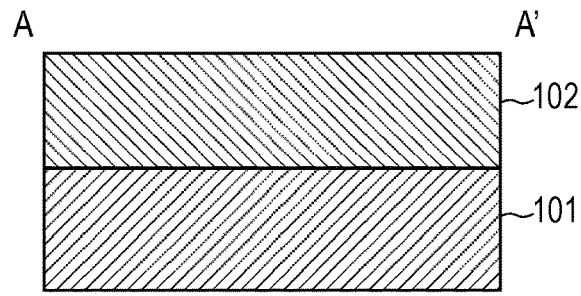
FIGS. 10A, 10B, 10C and 10D are schematic diagrams illustrating one example of a method of manufacturing the amplification transistor in the solid state image pickup element according to the sixth embodiment.

FIG. 10A is a schematic diagram illustrating one example of a process of forming the well region 102 in the method of manufacturing the amplification transistor M2 in the sixth embodiment. Boron is implanted into the semiconductor substrate 101 by, for example, ion implantation and thereby the p-type well region 102 is formed on the upper surface of the n-type semiconductor substrate 101.

Figure 10B:
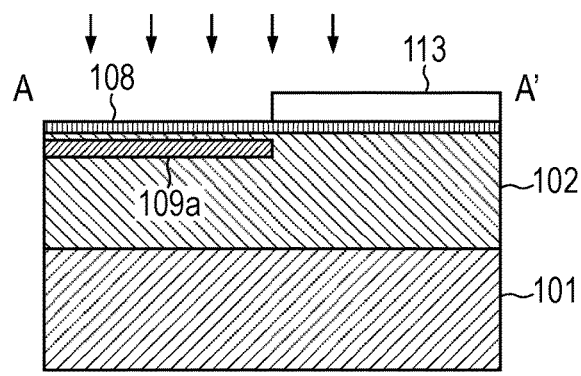

FIG. 10B is a schematic diagram illustrating one example of a process of forming the first channel doped region 109a in the method of manufacturing the amplification transistor M2 in the sixth embodiment. First, the silicon oxide film 108 is formed on the upper surface of the well region 102 by, for example, thermal oxidation. Then, the photoresist 113 is patterned on the drain-side upper surface of the oxide film 108 by, for example, lithography. Then, arsenic is implanted through the oxide film 108 from above the channel doped region 109 by using the photoresist 113 as the mask by, for example, ion implantation and thereby the first channel doped region 109a is formed in the source-side region of the channel doped region 109. In this case, the first channel doped region 109a is formed at a deep position in the well region 102 by increasing the energy for arsenic implantation to, for example, about 100 (keV). Then, the photoresist 113 is removed.

Figure 10C:
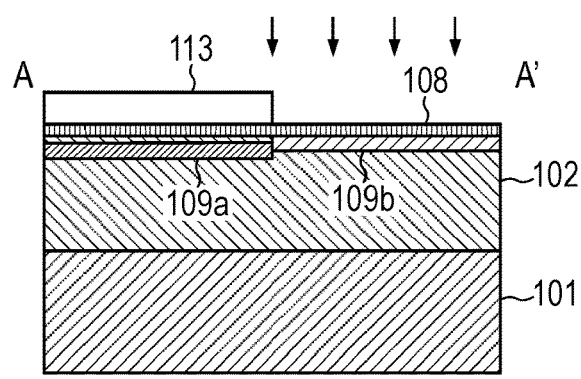

FIG. 10C is a schematic diagram illustrating one example of a process of forming the second channel doped region 109b in the method of manufacturing the amplification transistor M2 in the sixth embodiment. First, the photoresist 113 is patterned on the source-side upper surface of the oxide film 108 by, for example, lithography. Then, arsenic is implanted through the oxide film 108 from above the channel doped region 109 by using the photoresist 113 as the mask by, for example, ion implantation and thereby the second channel doped region 109b is formed in the drain-side region of the channel doped region 109. In this case, the second channel doped region 109b is formed at a shallow position in the well region 102 by reducing the energy for arsenic implantation to, for example, about 50 (keV). Then, the photoresist 113 is removed.

Figure 10D:
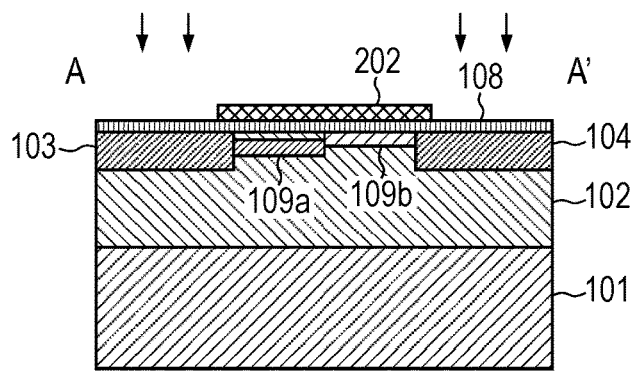

FIG. 10D is a schematic diagram illustrating one example of a process of forming the gate electrode 202, the source region 103 and the drain region 104 in the method of manufacturing the amplification transistor M2 in the sixth embodiment. Since the process of forming the gate electrode 202, the source region 103 and the drain region 104 illustrated in FIG. 10D is the same as the process illustrated in FIG. 3D in the first embodiment, description thereof is omitted.

As described above, in the sixth embodiment, the energy for ion implantation of the n-type impurity into the first channel doped region 109a is made larger than the energy for ion implantation of the n-type impurity into the second channel doped region 109b. Thereby, since the first channel doped region 109a is formed at the deep position in the channel region and the second channel doped region 109b is formed at the shallow position in the channel region, it becomes possible to simultaneously attain the reduction in noise and suppression of the reduction in threshold voltage of the amplification transistor M2.

Seventh Embodiment

Figure 11:
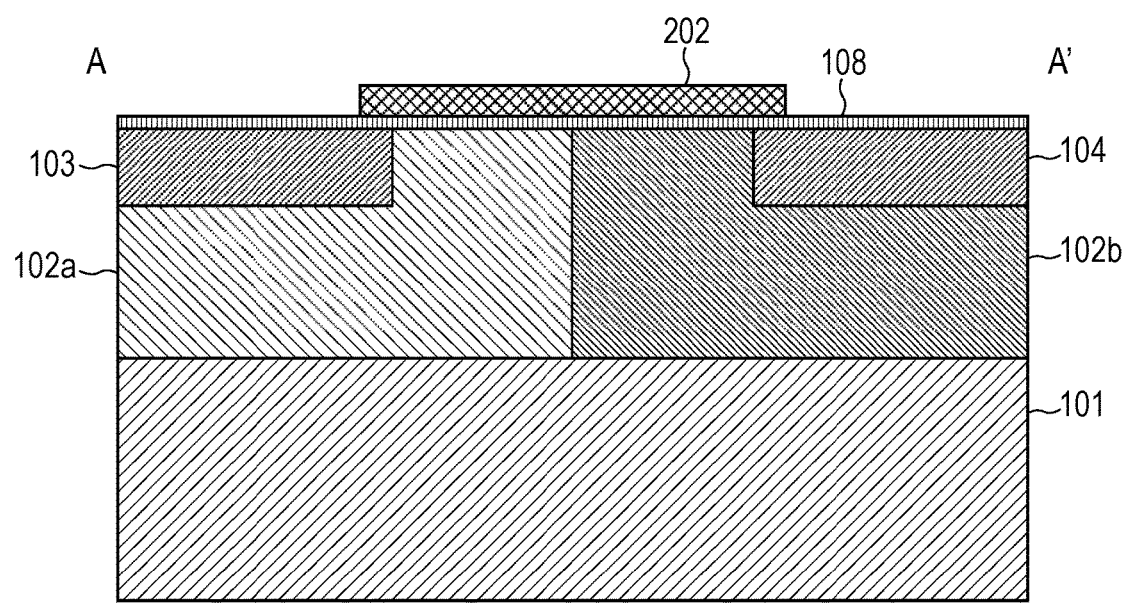
FIG. 11 is a sectional diagram along the A-A' line of an amplification transistor in a solid state image pickup element according to a seventh embodiment.

A solid state image pickup element according to the seventh embodiment will be described by using FIG. 11 and FIG. 12A to FIG. 12D. The layout of the pixel 100 in the seventh embodiment is the same as the layout of the pixel 100 in the first embodiment illustrated in FIG. 2A. However, the structure of the amplification transistor M2 in the section along the A-A' line in FIG. 2A is different from that in the first embodiment. FIG. 11 is a sectional diagram along the A-A' line of the amplification transistor M2 in the solid state image pickup element according to the seventh embodiment. Since the sectional diagram along the B-B' line and other configurations in the seventh embodiment are the same as those in the first embodiment, description thereof is omitted. In the following, parts which are different from those of the first embodiment in the structure of the amplification transistor M2 in the seventh embodiment will be described.

The amplification transistor M2 in the seventh embodiment illustrated in FIG. 11 is different from the amplification transistor M2 in the first embodiment illustrated in FIG. 2B in that the well region 102 is divided into a first well region 102a and a second well region 102b. Then, a p-type impurity concentration of the drain-side second well region 102b is made higher than a p-type impurity concentration of the source-side first well region 102a.

Thereby, the reduction in threshold voltage of the amplification transistor M2 is suppressed. That is, it is possible to ensure the linearity of the source follower circuit of the pixel 100.

Figure 12A:
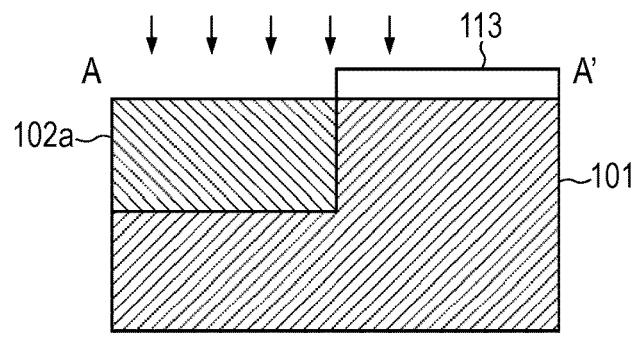
FIGS. 12A, 12B, 12C and 12D are schematic diagrams illustrating one example of a method of manufacturing the amplification transistor in the solid state image pickup element according to the seventh embodiment.

A method of manufacturing the amplification transistor M2 in the seventh embodiment illustrated in FIG. 11 will be described by using FIG. 12A to FIG. 12D. FIG. 12A is a schematic diagram illustrating one example of a process of forming the first well region 102a in the method of manufacturing the amplification transistor M2 in the seventh embodiment. First, the photoresist 113 is patterned on the drain-side upper surface of the semiconductor substrate 101 by, for example, lithography. Then, boron is implanted into the source-side upper surface of the semiconductor substrate 101 by using the photoresist 113 as the mask by, for example, ion implantation and thereby the p-type first well region 102a is formed in the n-type semiconductor substrate 101. Then, the photoresist 113 is removed.

Figure 12B:
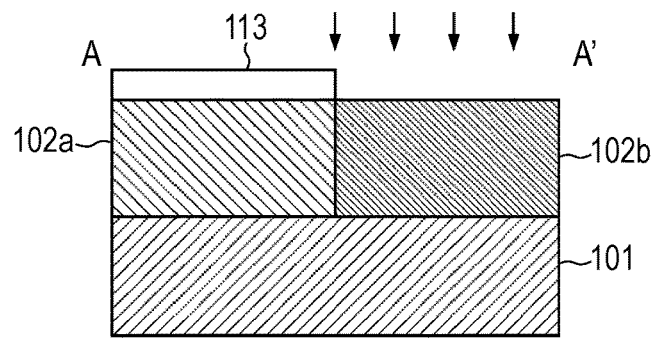

FIG. 12B is a schematic diagram illustrating one example of a process of forming the second well region 102b in the method of manufacturing the amplification transistor M2 of the solid state image pickup element according to the seventh embodiment. First, the photoresist 113 is patterned on the upper surface of the first well region 102a by, for example, lithography similarly to formation of the first well region 102a. Then, boron is implanted into the drain-side upper surface of the semiconductor substrate 101 by using the photoresist 113 as the mask by, for example, ion implantation and thereby the p-type second well region 102b is formed in the n-type semiconductor substrate 101. In this case, ion implantation is performed such that the p-type impurity concentration of the second well region 102b becomes higher than the p-type impurity concentration of the first well region 102a. Then, the photoresist 113 is removed.

Figure 12C:
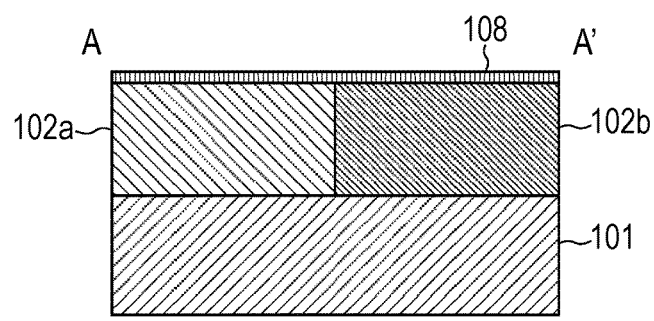
Figure 12D:
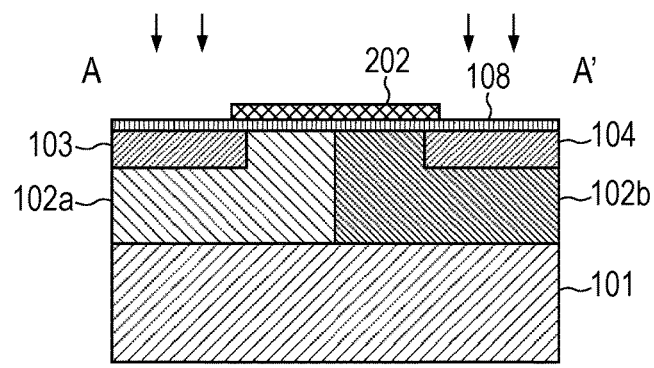

FIG. 12C is a schematic diagram illustrating one example of a process of forming the oxide film 108 in the method of manufacturing the amplification transistor in the seventh embodiment. In addition, FIG. 12D is a schematic diagram illustrating one example of a process of forming the gate electrode 202, the source region 103 and the drain region 104 in the method of manufacturing the amplification transistor M2 in the seventh embodiment. The processes of forming the oxide film 108, the gate electrode 202, the source region 103 and the drain region 104 illustrated in FIG. 12C and FIG. 12D are the same as the processes illustrated in FIG. 3C and FIG. 3D in the first embodiment. Incidentally, it is preferable to form the gate electrode 202 so as to partially superpose on the first well region 102a planarly.

As described above, the well region 102 of the amplification transistor M2 in the seventh embodiment is divided into the source-side first well region 102a and the drain-side second well region 102b. Then, the second conductivity type impurity concentration of the second well region of the channel region is made higher than the second conductivity type impurity concentration of the first well region of the channel region. Thereby, it becomes possible to suppress the reduction in threshold voltage of the amplification transistor M2 of the pixel 100.

Incidentally, although description has been made on the assumption that the amplification transistor M2 is the n-channel type MOS transistor, it is also possible to obtain the same advantageous effect also when the amplification transistor M2 is the p-channel type MOS transistor. That is, when the conductivity type of the amplification transistor M2 is defined as the first conductivity type and the conductivity type which is opposite to the first conductivity type is defined as the second conductivity type, it would be sufficient as long as the second conductivity type impurity concentration of the drain-side region is made higher than the second conductivity type impurity concentration of the source-side region. In addition, although in the above description, the channel doped region 109 is not provided in the channel region of the amplification transistor M2, the channel doped region 109 may be provided in the same manner as that in the first embodiment in order to improve the embedability of the amplification transistor M2.

Eighth Embodiment

The solid state image pickup element described in each of the above-mentioned embodiments is applicable to various image pickup systems. The digital still camera, the digital camcorder, a monitoring camera and so forth may be given as examples of the image pickup system.

Figure 13:
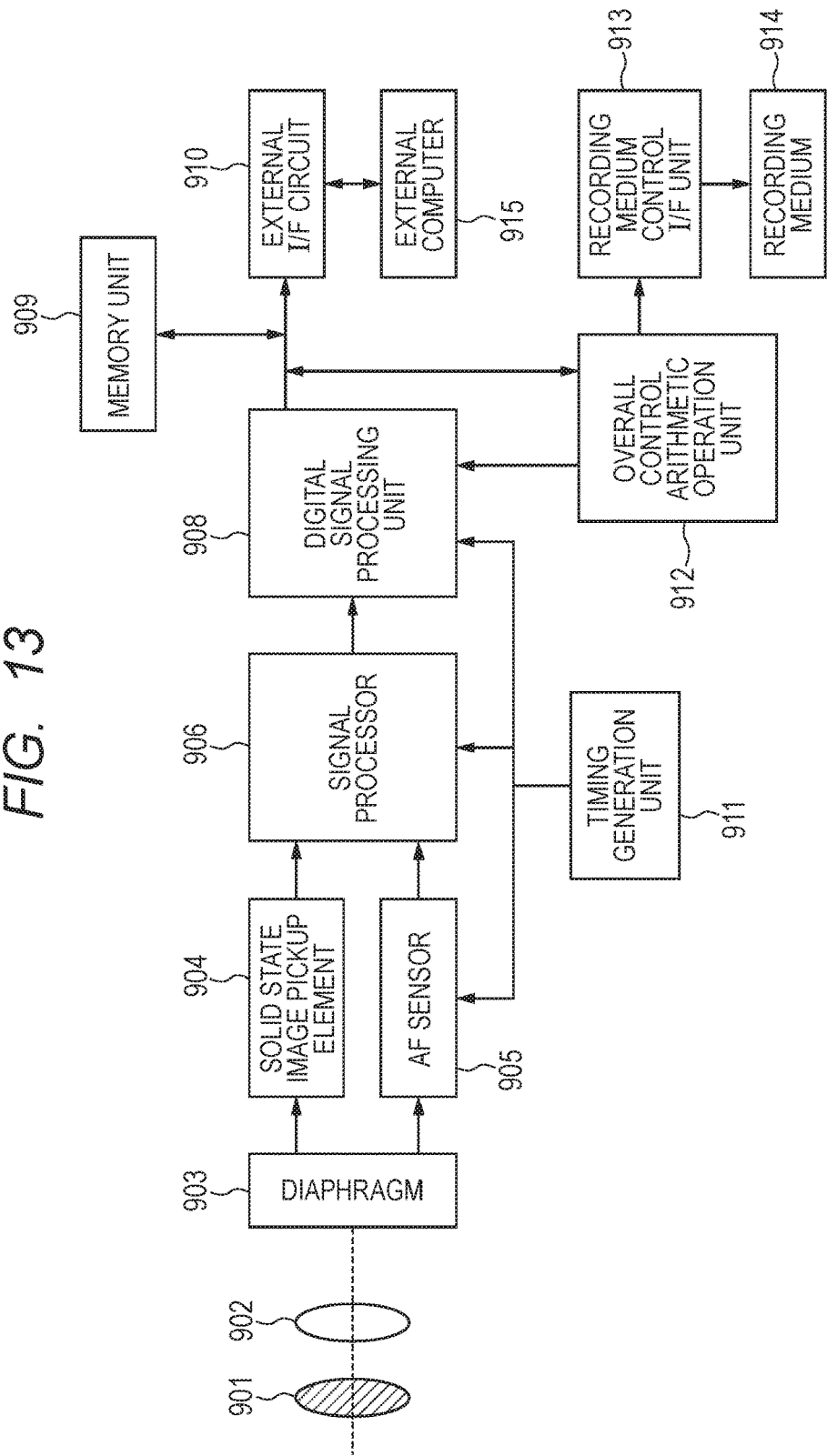
FIG. 13 is a block diagram illustrating one configurational example of an image pickup system according to an eighth embodiment.

FIG. 13 is a block diagram illustrating one configurational example of the image pickup system according to the eighth embodiment. The image pickup system illustrated in FIG. 13 includes a barrier 901, a lens 902, a diaphragm 903, a solid state image pickup element 904, an AF sensor 905, a signal processor 906, a digital signal processing unit 908, a memory unit 909, a timing generation unit 911, an overall control arithmetic operation unit 912. In addition, an external I/F circuit 910, a recording medium control I/F unit 913, a recording medium 914, an external computer 915 and so forth may be also included.

The barrier 901 protects the lens 902. The lens 902 forms an optical image of an object on the solid state image pickup element 904. The diaphragm 903 adjusts an amount of light which has passed through the lens 902. The solid state image pickup element 904 is the solid state image pickup element according to each of the above-mentioned embodiments and acquires the optical image of the object formed by the lens 902 as an image signal. The AF sensor 905 acquires focus information for AF processing. The signal processor 906 processes signals which are output from the solid state image pickup element 904 and the AF sensor 905.

The digital signal processing unit 908 performs various correcting operations and a data compressing operation on image data which has been output from the signal processor 906. The memory unit 909 temporarily stores the image data. The external I/F circuit 910 communicates with the external computer 915 and so forth. The timing generation unit 911 outputs various timing signals to the digital signal processing unit 908 and so forth. The overall control arithmetic operation unit 912 performs various arithmetic operations and controls the whole camera. The recording medium control I/F unit 913 controls the recording medium 914. The recording medium 914 is a semiconductor memory and so forth which records and reads out the acquired image data. The external computer 915 is an external computer which transmits the acquired image data.

Next, an operation that the image pickup system illustrated in FIG. 13 performs when photographing will be described. When the barrier 901 is opened, the overall control arithmetic operation unit 912 arithmetically operates a distance from the system to the object by phase difference detection on the basis of the signal output from the AF sensor 905.

Then, the lens 902 is driven on the basis of a result of the arithmetic operation and whether the lens is in focus is decided again. When it has been decided that the lens is out of focus, auto-focusing control for driving the lens 902 is again performed. Then, after it has been confirmed that the lens 902 is in focus, the solid state image pickup element 904 starts image picking-up. When the solid state image pickup element 904 outputs the picked-up image signal, the overall control arithmetic operation unit 912 reads out the image signal which has been output from the solid state image pickup element 904 via the signal processor 906 and the digital signal processing unit 908 and writes the image signal into the memory unit 909. Then, the overall control arithmetic operation unit 912 records data stored in the memory unit 909 into the recording medium 914 via the recording medium control I/F unit 913 or inputs the data into the external computer 915 and so forth via the external I/F circuit 910.

As described, it is possible for the image pickup system according to the eighth embodiment to perform the image picking-up operation by applying the solid state image pickup element 904. The image pickup system may include at least the solid state image pickup element 904 and the signal processor 906 which processes the output signal which has been output from the solid state image pickup element 904.

Incidentally, it is also possible to apply the above mentioned respective embodiments in combination. In addition, the amplification transistor M2 in each of the above-mentioned embodiments is also applicable as the amplification transistor of an AD conversion circuit in addition to application as the amplification transistor of the pixel 100.

Other Embodiments

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2016-115008, filed Jun. 9, 2016, which is hereby incorporated by reference herein in their entirety.

What is claimed is:

1. A solid state image pickup element comprising a MOS type transistor, which amplifies a signal based on electric charges generated in a photoelectric conversion unit of a pixel,
   wherein the MOS type transistor includes:
     a source region of a first conductivity type;
     a drain region of the first conductivity type provided in a region apart from the source region; and
     a channel region of the first conductivity type provided between the source region and the drain region,
   wherein the channel region includes:
     a first region provided in a region closer to the source region than the drain region; and
     a second region provided in a region closer to the drain region than the source region, and
   wherein a net impurity concentration of a first conductivity type impurity in the first region is higher than a net impurity concentration of the first conductivity type impurity in the second region.

2. The solid state image pickup element according to claim 1, wherein the channel region has a first channel doped region in the first region and has a second channel doped region in the second region, and
   wherein a concentration of the first conductivity type impurity in the first channel doped region is higher than a concentration of the first conductivity type impurity in the second channel doped region.

3. The solid state image pickup element according to claim 1, wherein the channel region has a first channel doped region in the first region and has a second channel doped region in the second region,
   wherein a concentration of a second conductivity type impurity in the second channel doped region is higher than a concentration of the second conductivity type impurity in the first channel doped region, and wherein a second conductivity type is opposite to the first conductivity type.

4. The solid state image pickup element according to claim 1, wherein a well region of the MOS type transistor includes:
   a first well region provided in a region closer to the source region than the drain region; and
   a second well region provided in a region closer to the drain region than the source region and having an impurity concentration different from the first well region,
   wherein the channel region in the first well region is the first region and the channel region in the second well region is the second region,
   wherein a net impurity concentration of a second conductivity type impurity in the second region is higher than a net impurity concentration of the second conductivity type impurity in the first region, and
   wherein a second conductivity type is opposite to the first conductivity type.

5. The solid state image pickup element according to claim 1, wherein the MOS type transistor has a second conductivity type channel stopper region on a boundary between a well region and an element isolation region,
   wherein a concentration of a second conductivity type impurity in a drain region side of the channel stopper region is higher than a concentration of the second conductivity type impurity in a source region side of the channel stopper region, and
   wherein a second conductivity type is opposite to the first conductivity type.

6. An image pickup system comprising:
   the solid state image pickup element according to claim 1; and
   a signal processor which processes a signal which is output from the solid state image pickup element.

7. The solid state image pickup element according to claim 1, wherein the net impurity concentration of the first conductivity type in the first region is a concentration at a first depth from a surface of a substrate, and the net impurity concentration of the first conductivity type in the second region is a concentration at a second depth from the surface of the substrate, which is the same as the first depth.

8. A solid state image pickup element comprising a MOS type transistor, which amplifies a signal based on electric charges generated in a photoelectric conversion unit of a pixel,
   wherein the MOS type transistor includes:
      a source region of a first conductivity type;
      a drain region of the first conductivity type provided in a region apart from the source region; and
      a channel region of a second conductivity type, which is opposite to the first conductivity type, provided between the source region and the drain region,
   wherein the channel region includes:
      a first region provided in a region closer to the source region than the drain region; and
      a second region provided in a region closer to the drain region than the source region, and
   wherein a net impurity concentration of a second conductivity type impurity in the second region is higher than a net impurity concentration of the second conductivity type impurity in the first region.

9. The solid state image pickup element according to claim 8, wherein the channel region has a first channel doped region in the first region and has a second channel doped region in the second region, and
   wherein a concentration of a first conductivity type impurity in the first channel doped region is higher than a concentration of the first conductivity type impurity in the second channel doped region.

10. The solid state image pickup element according to claim 8, wherein the channel region has a first channel doped region in the first region and has a second channel doped region in the second region, and
   wherein a concentration of the second conductivity type impurity in the second channel doped region is higher than a concentration of the second conductivity type impurity in the first channel doped region.

11. The solid state image pickup element according to claim 8,
   wherein a well region of the MOS type transistor includes:
      a first well region provided in a region closer to the source region than the drain region; and
      a second well region provided in a region closer to the drain region than the source region and having an impurity concentration different from the first well region, and
   wherein the channel region in the first well region is the first region and the channel region in the second well region is the second region.

12. The solid state image pickup element according to claim 8, wherein the MOS type transistor has a second conductivity type channel stopper region on a boundary between a well region and an element isolation region, and
   wherein a concentration of the second conductivity type impurity in a drain region side of the channel stopper region is higher than a concentration of the second conductivity type impurity in a source region side of the channel stopper region.

13. The solid state image pickup element according to claim 8, wherein the net impurity concentration of the second conductivity type in the first region is a concentration at a first depth from a surface of a substrate, and the net impurity concentration of the second conductivity type in the second region is a concentration at a second depth from the surface of the substrate, which is the same as the first depth.

14. An image pickup system comprising:
   the solid state image pickup element according to claim 8; and
   a signal processor which processes a signal which is output from the solid state image pickup element.

* * * * *